United States Patent [19]

Metz

[11] Patent Number: 4,801,827

[45] Date of Patent: Jan. 31, 1989

[54] ADJUSTABLE DELAY ELEMENT FOR DIGITAL SYSTEMS

[75] Inventor: Arthur J. Metz, Gervais, Oreg.

[73] Assignee: Tektronix, Inc., Beaverton, Oreg.

[21] Appl. No.: 115,785

[22] Filed: Nov. 2, 1987

[51] Int. Cl.$^4$ .......................... H03K 5/13; H03K 5/159
[52] U.S. Cl. ..................................... 307/602; 307/529; 307/608; 328/55
[58] Field of Search ............... 307/602, 603, 605, 606, 307/608, 529, 494; 328/55, 56, 129.1; 333/165, 166

[56] References Cited

U.S. PATENT DOCUMENTS

| | | | |
|---|---|---|---|
| 3,077,564 | 2/1963 | Forrer | 333/166 |
| 3,293,552 | 12/1966 | Sichak et al. | 328/56 |
| 3,686,572 | 8/1972 | Guilhem et al. | 328/55 |
| 4,293,831 | 10/1981 | Lueder | 333/165 |

Primary Examiner—John S. Heyman
Assistant Examiner—Timothy P. Callahan
Attorney, Agent, or Firm—Mark L. Becker; Peter J. Meza

[57] ABSTRACT

An adjustable delay element for digital systems includes a high-pass filter in parallel with a low-pass filter. The high-pass filter passes the higher frequency component of the digital signal and the low-pass filter passes the lower frequency component to introduce a delay into the digital signal. A current multiplier directs a selectable portion of the higher frequency component to aid or oppose the lower frequency component to vary the delay within the signal. An output stage receives the lower frequency component with the selected portion of the higher frequency component and reproduces the digital signal with the delay. Embodiments for both differential and single-ended versions of the corresponding delay element are disclosed.

6 Claims, 3 Drawing Sheets

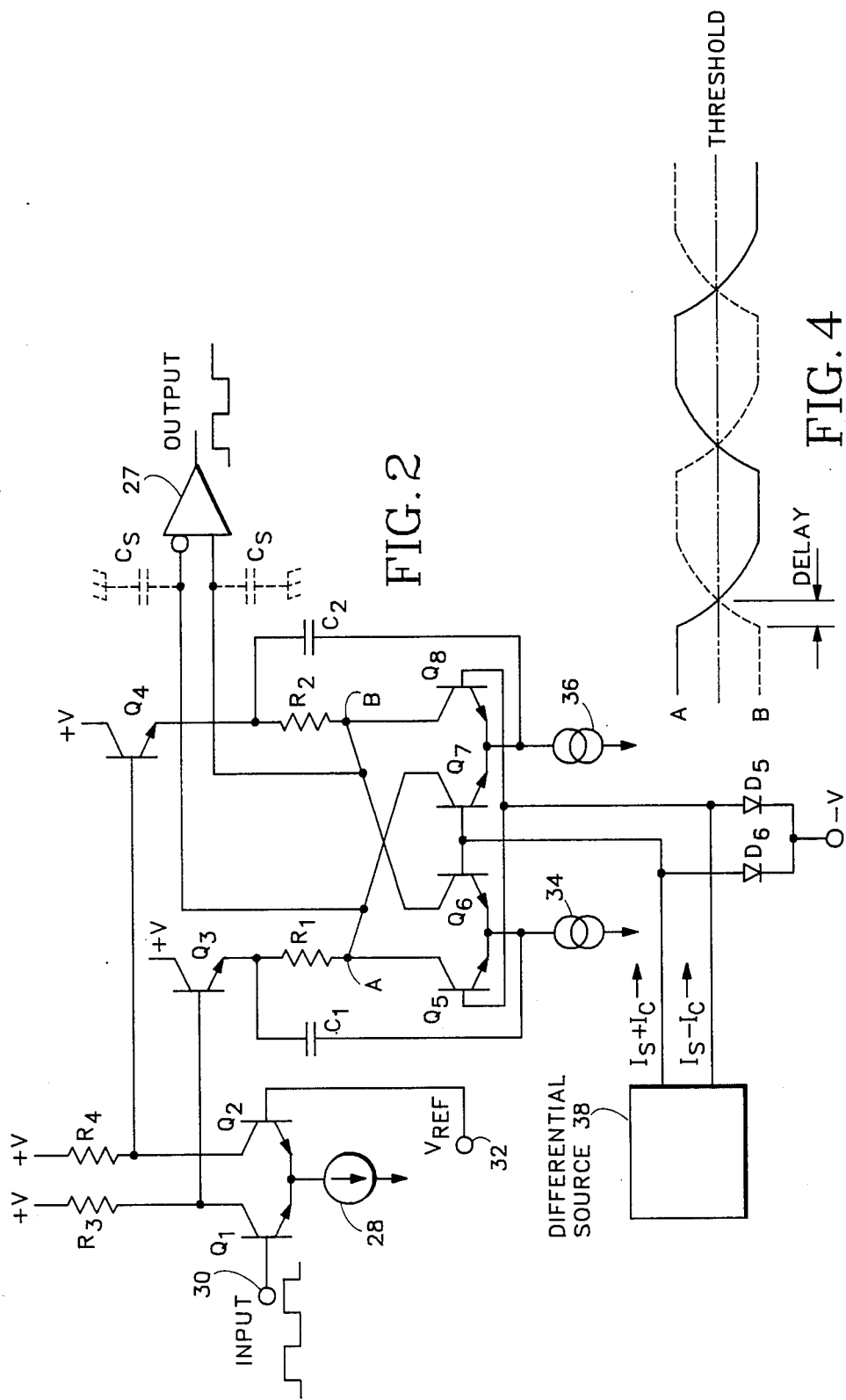

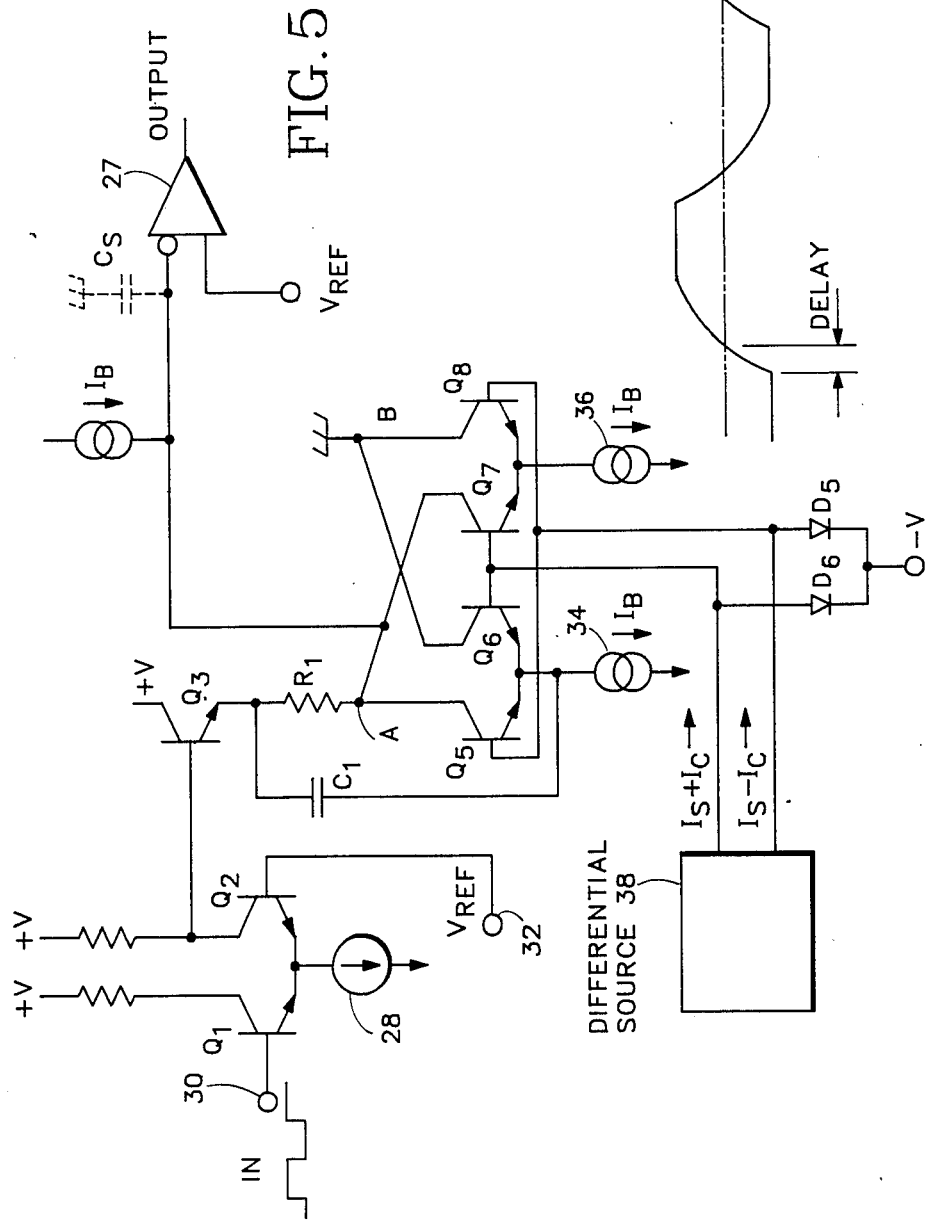

ADJUSTABLE DELAY ELEMENT FOR DIGITAL SYSTEMS

TECHNICAL FIELD

This invention relates generally to delay elements and more particularly to an adjustable delay element with improved linear control and increased adjustment range.

BACKGROUND OF THE INVENTION

One goal in the design of digital systems is to clock data and control signals through the system at high clock rates. The higher the clock rate, the faster the these signals move through the system. To achieve maximum system performance, it is necessary to maintain a precise timing relationship between the clock and data paths. In a latch, for example, the data must be present at the input before the latch is clocked. A delay element is used to introduce the appropriate delay into the clock path to produce the desired timing. Often, an adjustable delay element is preferred to optimize circuit parameters such as set-up or hold time for a latch or settling time for a digital-to-analog converter.

Prior adjustable delay elements have tended to exhibit a nonlinear response to the delay control and a limited adjustment range. For example, a delay element commonly used in ECL designs is based upon controlling the slew rate of the output emitter followers by adjusting the standing current in these emitter followers. This method has minimal adjustment range because only the negative-going edges are significantly affected by the standing current. In single-ended use, this delay element is nonsymmetrical, producing variable delay for the negative-going signals but essentially fixed delay for positive-going signals. In differential systems, very slow negative-going edges produce only small delay changes, and the delay generated is a nonlinear function of the control current.

SUMMARY OF THE INVENTION

An object of the invention, therefore, is to provide an adjustable delay element with improved linear control.

Another object of the invention is to provide such a delay element that treats positive and negative edges equally, that is, symmetrically.

Another object of the invention is to provide such a delay element with an increased range of delay.

In accordance with the present invention, an adjustable delay element includes a low-pass filter means in parallel with a high-pass filter means. The low-pass filter means passes the lower frequency component of the digital signal, the lower frequency component having a delay relative to the complete digital signal. The high frequency path passes the higher frequency component of the signal. A control means directs a selectable portion of the higher frequency component to aid or oppose the lower frequency component to vary the delay within the signal. An output stage then receives the lower frequency component and the selected portion of the higher frequency component and reproduces the digital signal with the corresponding delay.

Two embodiments of the invention are disclosed. A differential version utilizes both the in-phase and out-of-phase voltage signals of a differential input stage. The higher frequency component from each voltage signal can be directed in a selectable portion to aid or oppose the lower frequency component. This provides a wide range of delay in the digital signal. In a single-ended version, only the in-phase output voltage is utilized. The range of the delay is more limited but is still linearly related to the control currents.

Both of the embodiments provide an adjustable delay element that has a symmetrical delay with respect to the positive-going and negative-going transitions of the digital signal.

The foregoing and other objects, features, and advantages of the invention will become more apparent from the following detailed description of preferred embodiments which proceed with reference to the accompanying drawings.

BRIEF DESCRIPTION OF THE DRAWINGS

FIG. 2 shows a specific embodiment of the delay element of FIG. 1.

FIG. 4 shows how the voltage signals are compared to produce the delay at the output stage of the delay element.

FIG. 5 shows a single-ended embodiment of the adjustable delay element of FIG. 1.

FIG. 6 shows how the voltage signal in the single-ended embodiment is compared to a threshold voltage to produce the delay at the output stage of the delay element.

DETAILED DESCRIPTION

Figure 1:
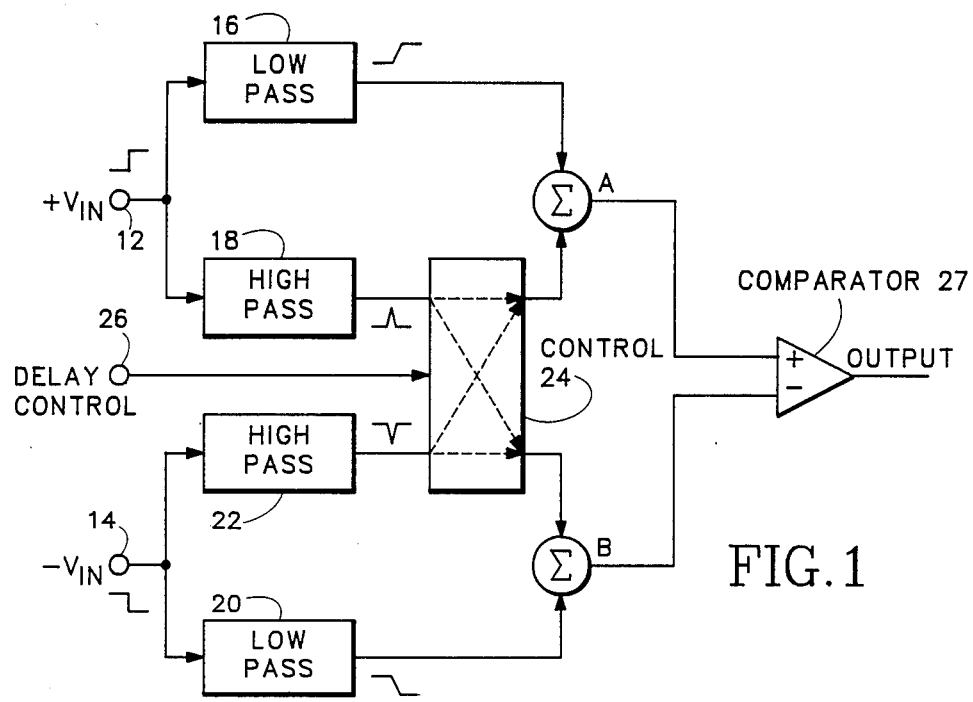
FIG. 1 is a block diagram of an adjustable delay element in accordance with the present invention.

Referring now to FIG. 1 of the drawings, a block diagram of an adjustable delay element according to the invention is shown. A pair of differential voltage signals $+V_{IN}$ and $-V_{IN}$ are present at input terminals 12 and 14, respectively. The voltage signals $+V_{IN}$ and $-V_{IN}$ represent a digital clock signal and may be the output of ECL gate or other digital logic circuit, as will be further described with respect to specific embodiments. The voltage signal $+V_{IN}$ is applied to a node to which a low-pass filter 16 and a high pass filter 18 are coupled in parallel. The low-pass filter 16 passes the lower frequency component of $+V_{IN}$ along a low frequency path to a summing node A. This lower frequency component has an inherent delay relative to the complete voltage signal because the higher frequency component that provides the fast transition of the signal has been filtered out. The high-pass filter in turn passes an in-phase higher frequency component along a separate, high frequency path. Similarly, the voltage signal $-V_{IN}$, which is of opposite phase to $+V_{IN}$, is applied to a circuit node to which a low-pass filter 20 and high-pass filter 22 are coupled in parallel. The low-pass filter 20 passes the lower frequency component of $-V_{IN}$ along a second low frequency path to a summing node B. The high-pass filter 22 in turn passes the in-phase higher frequency component along a second separate high frequency path.

The high frequency paths containing filters 18 and 22 are coupled to a control element 24 that may be adjusted to pass selectable portions of each higher frequency component to each of the summing nodes A or B as indicated by the internal dashed lines. The control element 24 is linearly responsive to a delay control signal at its input 26 that determines which portion of each higher frequency components is directed to each summing node. Thus, the delay in the digital signal is linearly related to the setting of the control signal.

At one extreme, the control signal may direct the control element 24 to couple directly the entire portion of each higher frequency component to the summing node receiving the lower frequency component of the same phase. Such coupling is represented by the parallel dashed lines within element 24, with the output of the filter 18 being coupled to summing node A and the output of filter 22 being coupled to summing node B. Because these higher frequency components are in phase with the respective lower frequency components at the summing nodes, they aid the lower frequency components. This summation at the nodes A and B substantially restores the shape of the original differential voltage signal (albeit with a slight loss) and removes any delay in its transmission.

At the other extreme, the control signal may direct control element 24 to cross couple each higher frequency component to the summing node receiving the lower frequency component of the opposite phase. Such coupling is represented by the crossed dashed lines within element 24, with the output of filter 18 being coupled to summing node B and the output of filter 22 being coupled to summing node A. These higher frequency components are out-of-phase with the lower frequency components with which they are summed, thus opposing the lower frequencies and further increasing the delay in the voltage signals. In between these extremes exists the range of delay, with selectable portions of each higher frequency component being directed to both nodes A and B to aid or oppose the lower frequency components.

The outputs from summing nodes A and B are coupled to an output stage such as comparator 27 for sharpening the level transitions. The comparator 24 changes state as one differential voltage exceeds the other and thereby reproduces the digital signal with a delay corresponding to the delay introduced into the differential voltages. The delay is symmetrical for the positive-going and negative-going transitions of the differential voltages and thus has no adverse effect on the reproduced digital signal.

Referring now to FIG. 2 of the drawings, a specific embodiment of the delay element in FIG. 1 is shown coupled to an emitter-coupled logic (ECL) gate. The ECL gate comprises a pair of opposed transistors $Q_1$ and $Q_2$ with their emitters coupled together and to a standing or bias current source 28. A terminal 30 on the base of transistor $Q_1$ receives the digital input signal (herein a voltage signal) for comparison against a reference voltage $V_{REF}$ present at a terminal 32 on the base of transistor $Q_2$. The reference voltage $V_{REF}$ in an ECL gate is typically set midway between the input signal voltage that produces a logic 1 and the voltage that produces a logic 0. Connected to the collectors of transistors $Q_1$ and $Q_2$ are load resistors $R_3$ and $R_4$, respectively, and the supply voltage $V_{CC}$. When the digital signal is a logic 1, for example, the bias current from the current source 28 is directed through transistor $Q_1$ which conducts and draws current through resistor $R_1$, decreasing the collector voltage of transistor $Q_1$. Transistor $Q_2$ is shut off, and its collector voltage rises toward the supply voltage $V_{CC}$. Conversely, when the input signal is a logic 0, transistor $Q_1$ is shut off and transistor $Q_2$ conducts. The output voltage at the collector of transistor $Q_2$ therefore follows the input voltage and is in-phase with the input, while the output voltage at the collector of transistor $Q_1$ is out-of-phase with the input voltage. Coupled to the outputs of the ECL gate as emitter followers are transistors $Q_3$ and $Q_4$. The emitter followers isolate the ECL stage from the circuitry comprising the delay element.

The low-pass filter 16 comprises in FIG. 2 a resistor $R_1$ and the stray capacitance and input capacitance of comparator 27 represented b $C_s$. The resistor $R_1$ is coupled to the emitter of transistor $Q_3$, as is capacitor $C_1$ which is part of high-pass filter 18. Similarly, a resistor $R_2$ and the stray and input capacitances of comparator 27 comprises low-pass filter 20. Resistor $R_2$ and capacitor $C_2$ are coupled to the emitter of transistor $Q_4$. Resistor $R_2$ and capacitor $C_2$ are of values equal to resistor $R_1$ and capacitor $C_1$, respectively. Capacitors $C_1$ and $C_2$ are chosen to restore the higher frequency components filtered by the capacitance $C_s$. In most circumstances the value of $C_1$ and $C_2$ will be similar to that of $C_s$.

Resistor $R_1$ is connected at its other end through summing node A to one input of the output stage comprising comparator 27, and resistor $R_2$ is similarly connected at its other end through summing node B to the other input of the comparator. The high frequency paths containing capacitors $C_1$ and $C_2$ connect at their other ends to the control element 24, which in this embodiment comprises a current multiplier such as a conventional Gilbert gain cell that includes transistors $Q_5$ through $Q_8$ and diodes $D_5$ and $D_6$. The current multiplier is adapted to direct a selectable portion of each higher frequency component passed by a high-pass filter to aid or oppose a lower frequency component passed by a low-pass filter. The collector of transistor $Q_5$ is coupled and the collector of transistor $Q_7$ is cross coupled to resistor $R_1$ at node A. Symmetrically, the collector of transistor $Q_8$ is coupled and the collector of transistor $Q_6$ is cross coupled to the resistor $R_2$ at node B. Emitter coupled pairs of transistors $Q_5$, $Q_6$ and $Q_7$, $Q_8$ are each biased by current sources 34 and 36, respectively. The high frequency path of capacitor $C_1$ connects to the coupled emitters of transistors $Q_5$ and $Q_6$. The path of capacitor $C_2$ connects to the coupled emitters of transistors $Q_7$ and $Q_8$. The emitter coupled pairs are controlled by a pair of differential control currents $I_S + I_c$ and $I_S - I_c$ from a differential source represented by box 38, with $I_S + I_c$ being directed to diode $D_6$ and to the base of transistors $Q_6$ and $Q_7$ and $I_S - I_c$ being directed to diode $D_5$ and to the base of transistors $Q_5$ and $Q_8$. As taught by Gilbert, the currents in $Q_5$ and $Q_6$ (and also $Q_8$ and $Q_7$) are a ratio of the currents established in $D_5$ and $D_6$. The differential currents $I_S + I_c$ and $I_S - I_c$ oppose each other such that the transistors $Q_6$ and $Q_7$ are more conductive than transistors $Q_5$ and $Q_8$ when $+I_c$ exceeds $-I_c$ and transistors $Q_6$ and $Q_7$ are more conductive than transistors $Q_5$ and $Q_8$ when $-I_c$ exceeds $+I_c$.

Figure 3:
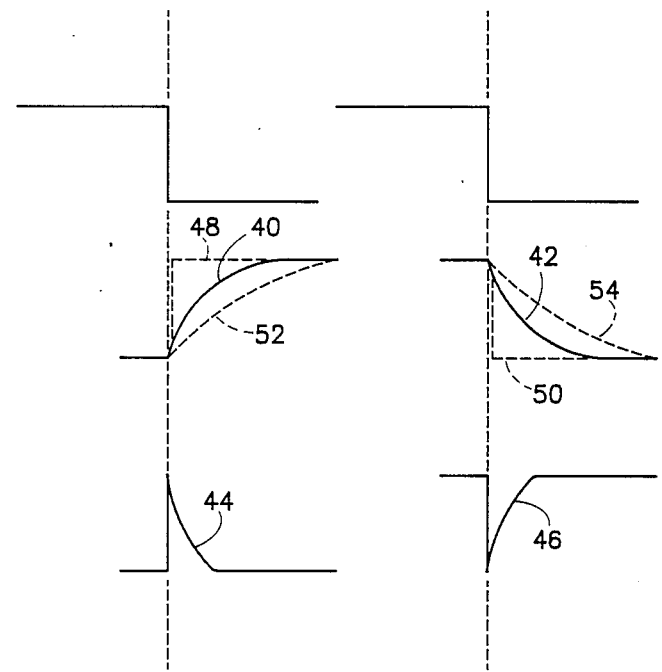
FIG. 3 is a timing diagram of signal waveforms within the delay element.

Operation of the delay element can now be understood with additional reference to FIGS. 3 and 4. Assuming the negative-going transition of a digital signal is present at the..input terminal 30, FIG. 3 shows immediately below the digital signal the waveform 40 of the lower frequency component passed by resistor $R_1$ and stray capacitance $C_s$ and the waveform 42 passed by resistor $R_2$ and stray capacitance $C_s$. Below waveforms 40, 42 are the waveforms 44 and 46 of the higher frequency component passed by capacitors $C_1$ and $C_2$, respectively. Selectable portions of the higher frequency components can then be directed through the high frequency paths to aid or oppose the lower frequency components to vary the delay of the output voltage. Because of the nature of the current multiplier, this delay is nearly a linear function of the control currents $+I_c$ and $-I_c$. At one extreme, the delay is minimized by increasing $-I_c$ so that transistors $Q_5$ and $Q_8$ are fully on and transistors $Q_6$ and $Q_7$ are shut off. Referring again to FIG. 3, The higher frequency components in the form of currents pass through transistors $Q_5$ and $Q_8$ to resistors $R_1$ and $R_2$ to aid the lower frequency components and reproduce substantially the original waveform of the digital signal as shown in dashed lines 48 and 50, thereby decreasing the delay. At the other extreme, delay is maximized by increasing $+I_c$ and decreasing $-I_c$ such that transistors $Q_6$ and $Q_7$ are fully on and transistors $Q_5$ and $Q_6$ are shut off. The higher frequency components are now passed through the collectors of transistors $Q_6$ and $Q_7$ and cross coupled to resistors $R_1$ and $R_2$ to oppose the lower frequency component, increasing the delay, as shown by dashed lines 52 and 54. When the control currents are equal, all transistors $Q_5$ through $Q_8$ are on and the higher frequency component from each high frequency path is split equally between nodes A and B, cancelling any effect on the lower frequency component.

FIG. 4 shows the differential voltages at the inputs to comparator 27. The figure indicates the median delay and its symmetrical nature for the positive-going and negative-going transitions of the digital input signal. The differential voltages that comprise the digital signal are reconverted by the comparator 27 to a single-ended output signal with the corresponding delay. Of course, differential outputs may be obtained if desired. The comparator changes its output state at a threshold level that remains constant as the delay is varied because of the aforementioned symmetry at which the signals cross. FIG. 4 shows the threshold level as a series of intersections between the two differential voltages.

The principles explained above may be suitably employed in a single-ended version of the delay element as shown in FIG. 5, with like reference numerals retained for like components of FIG. 2. The in-phase voltage is the only voltage utilized. The circuit functions like that in FIG. 2 except that the delay is now determined solely by the resistor $R_1$ and the capacitance $C_s$. No higher frequency component is cross coupled to oppose the low frequency component. The higher frequency component that passes through the capacitor $C_1$ may be added back to the lower frequency component through the collector of transistor $Q_5$ to minimize the delay or may be discarded altogether through the collector of $Q_6$ to ground. Transistors $Q_7$ and $Q_8$ are used to maintain constant standing current to resistor $R_1$ and transistor $Q_3$. The comparator 27 has as its second input the reference voltage $V_{REF}$ that sets the threshold of the comparator midway between the high and low magnitudes of the voltage present at the input of the comparator. With reference to FIG. 3, the range of delay in this embodiment extends from the solid line 42 to the minimum delay represented by dashed line 50. FIG. 6 shows the range of delay and that the symmetry is preserved in the positive-going and negative-going transitions of the in-phase voltage so that the delay is linearly related to the magnitude of the control currents.

Having illustrated and described the principles of the invention in preferred embodiments, it should be apparent to those skilled in the art that the invention can be modified in arrangement and detail without departing from such principles. For example, the invention is by no means limited to ECL logic circuits. An amplifier with variable bandwidth, for example, can be formed by replacing the input and output stages with linear amplifiers. I claim all modifications coming within the spirit and scope of the following claims.

I claim:

1. An adjustable delay circuit for delaying passage of a digital signal, comprising:

low-pass filter means for passing the lower frequency component of the digital signal, the lower frequency component having a delay relative to the digital signal; high-pass filter means in parallel with the low-pass filter means for passing the higher frequency component of the digital signal;

control means for coupling a selectable portion of the higher frequency component to be summed with the lower frequency component to vary the delay produced by the lower frequency component; and an output stage for receiving the lower frequency component and selected portion of the of the higher frequency component to reproduce the digital signal with the corresponding delay.

2. The delay circuit of claim 1 in which the control means comprises a current multiplier that couples the high frequency component to the lower frequency component with which the higher frequency component is in phase in response to a control signal.

3. The delay circuit of claim 1 in which the low-pass filter means comprises a resistor and stray capacitance within the circuit and the high-pass filter means comprises a capacitor adapted to pass the higher frequency component filtered by the low-pass filter means.

4. The adjustable delay circuit of claim 1 in which the control means is adapted to provide a delay in the digital signal symmetrical with respect to the positive-going and negative-going transitions thereof.

5. A variable delay circuit for delaying passage of a digital signal, comprising:

an input stage for producing a pair of oppositely phased differential output voltage signals representing the digital signal;

a pair of low-pass filters each receiving one of the output voltage signals from the input stage for passing the lower frequency component of the output voltage signals, each lower frequency component having a delay relative to the output voltage signal;

a current multiplier comprising two pairs of emitter-coupled transitors, the collector of one transistor of each pair coupled directly to the output of one low-pass filter and the collector of the other transistor of each pair cross coupled to the output of the other low-pass filter, the bases of the directly coupled transistor tied together and the bases of the cross-coupled transistors tied together;

a pair of high-pass filters each having an input and an output, each input receiving one of the output voltage signals from the input stage and each output being respectively coupled to the emitters of each pair of emitter-coupled transistors;

means for providing a pair of differential currents, one to the bases of the directly coupled transistors and one to the bases of the cross-coupled transistors, to couple a selectable portion of the higher frequency component from each high-pass filter to be summed with the lower frequency component from each low-pass filter to vary the delay within the output voltage signals; and an output stage comprising a comparator for comparing output voltage signals, each including the lower frequency component and the selectable portion of the higher frequency component, and reproducing the digital signal with corresponding delay as one output voltage signals exceeds the other and causes the comparator to change state.

6. An adjustable delay circuit from delaying passage of a digital signal, comprising:

an emitter follower for receiving the digital signal;

a low-pass filter coupled to the emitter of the emitter follower for passing the lower frequency component of the digital signal to introduce a delay into the signal;

a high-pass filter coupled to the emitter of the emitter follower in parallel with the low-pass filter for passing the high frequency component of the digital signal;

control means for biasing the emitter follower with a constant current and for coupling a selectable portion of the high frequency component to be summed with the lower frequency component; and an output stage for receiving the lower frequency component and selected portion of the higher frequency component to reproduce the digital signal with the delay.

* * * * *